United States Patent [19]

Le Can

[11] 4,041,474
[45] Aug. 9, 1977

[54] MEMORY MATRIX CONTROLLER

[75] Inventor: Claude Jan Principe Frederik Le Can, Nijmegen, Netherlands

[73] Assignee: U.S. Philips Corporation, New York, N.Y.

[21] Appl. No.: 653,923

[22] Filed: Jan. 30, 1976

Related U.S. Application Data

[63] Continuation of Ser. No. 512,684, Oct. 7, 1974.

[30] Foreign Application Priority Data

Oct. 11, 1973 Netherlands .......................... 7313983

[51] Int. Cl.² ............................................. G11C 11/40
[52] U.S. Cl. .................. 340/173 R; 307/238
[58] Field of Search .................... 340/173 R; 307/238

[56] References Cited

U.S. PATENT DOCUMENTS 3,899,777  8/1975  Feicht ............................. 340/173 R
3,983,543  9/1976  Cordaro .......................... 340/173 R Primary Examiner—Terrell W. Fears
Attorney, Agent, or Firm—Frank R. Trifari; Daniel R. McGlynn

[57] ABSTRACT

A device including a memory matrix comprising memory cells provided at crossings of rows and columns, wherein on selection of a given row of the matrix, selection means enable a memory element associated with a further row to be selected. The selection means are driven from a drive device on the basis of a one-step Increment instruction and/or a one-step Decrement instruction. The drive device is a component part of an arithmetic device in which arithmetic carry-bits arise.

1 Claim, 12 Drawing Figures

| D | I | b | b̄ | A | c | c̄ | W | |
|---|---|---|---|---|---|---|---|---|
| 1 | 0 | 0 | 1 | 0 | 0 | 1 | Wi | } DECR |
| 1 | 0 | 1 | 0 | 1 | 1 | 0 | Wi-1 | |
| 0 | 1 | 0 | 1 | 1 | 1 | 0 | Wi-1 | } INCR |
| 0 | 1 | 1 | 0 | 0 | 0 | 1 | Wi | |

MEMORY MATRIX CONTROLLER

This is a continuation of application Ser. No. 512,684, filed Oct. 7, 1976.

The invention relates to a device which includes at least one memory matrix comprising memory elements provided at crossings of rows and columns, in which memory matrix at at least one row for at least one memory element associated with the row for at least one memory element associated with a further row first and second selection means are provided by which, on selection of the said row, at will either the or each memory element associated with this row or the or each memory element associated with the further row may be selected and in which furthermore a control signal is receivable at a first terminal of the first selection means and the complement of the control signal is receivable at a second terminal of the second selection means.

Such matrices used in the abovementioned device are known in several forms. In the known device, the object of selecting either a memory element (or an entire memory word) of a row or a memory element (or an entire memory word) of a further row is purely a matter of addressing. The least significant address bit (0 or 1) addresses either the one row or a further (usually the next) row in the matrix.

It is an object of the present invention to show that there is an interesting possibility of using such matrices in which the addressing itself no longer is the purpose but only a means to accomplish another purpose. In information processing frequently what are generally referred to as "step" instructions, i.e. increment (+ step) and decrement (− step) instructions, are used which are to be executed by information processing devices. In a device according to the invention the "step" instruction can simply be executed. For this purpose the device according to the invention is characterized in that provision made of a control device in which the control signals can be determined on the basis of a one-step INCREMENT instruction and/or a one-step DECREMENT instruction. If particularly addition and subtraction operations are concerned, an embodiment of the device according to the invention is characterized in that the control device is a part of a computer, the control signal being a carry signal.

A device according to the invention in which the invention idea is extensively used is characterized in that the memory matrix is a read-only memory matrix in which a row can be selected by the first selection means and the next subsequent row can be selected by the second selection means, the control device comprising a second read-only memory matrix in which one of the columns is a carry signal accumulating column, while the said first and second memory matrices, which each include a scanning register which acts as an address selector, together form an addition-subtraction arithmetic unit. In the abovedescribed device it is not necessary to separately provide first and second selection means at a row of the memory matrix for each memory element associated with this row and for each memory element associated with a further row. This is necessary only in cases where bit selection is required, i.e. when each memory element must be selectable. If, however, word selection is sufficient, i.e. if an entire row of memory elements is to be selectable at once, in a memory matrix as used in the device according to the invention the first selection means may be common to all memory elements associated with a row and the second selection means may be common to all the memory elements associated with a further row. If especially when integrated-circuit techniques are used for manufacturing the memories, the row- and -column structure of a memory matrix is required to be used and retained as far as possible, for the memory matrix as used in the device according to the invention the first selection means may be connected, for each row, through a first common subrow lead to a first drive column common to all the first selection means, and the second selection means may be connected, for each row, through a second common sub-row lead is a drive column common to all the second selection means, the sub-row leads extending in the same direction as the rows while the dirve columns extend in the same direction as the columns of the memory matrix. Again this applies in particular to a memory matrix permitting bit selection. If the memory matrix is intended for word selection and if for each row common first selection means and common second selection means are provided, the above requirement may also be satisfied in that the first selection means are connected to a first drive column common to all first selection means and in that the second selection means are connected to a drive column common to all the second selection means, the drive columns extending in the same direction as the columns of the matrix. Whether this set-up can be carried into practice for a given type of memory depends upon the requirements to be satisfied with respect to, for example, surface area and spread. The common first and common second selection means for each row used in this set-up will have to supply the current for an entire row, so that they must be sufficiently "robust" to be able to satisfy the particular speed requirements.

In practice, the selection means will be AND-funtion gates. These can be compared with controlled switches. It should be mentioned that in practice the further row of the matrix frequently is an adjacent (next subsequent or next previous) row.

The memory elements for the memory matrix according to the invention may be of various natures; magentic cores, semiconductor elements (dynamic or static), and so on. The use of the inventive idea is of particular interest in memories of the read-only type. In such a memory frequently words which serve as control words in microprograms are stored. When carrying out microprograms the above described "step" instruction often occur.

In the following part of this specification the memory matrix according to the invention and memories including such matrices will be described more fully with reference to the accompanying diagrammatic drawings.

FIG. 9 shows an electric detailed circuit of a read-write memory matrix suitable for use in a device according to the invention as shown in FIG. 6a.

Figure 1:
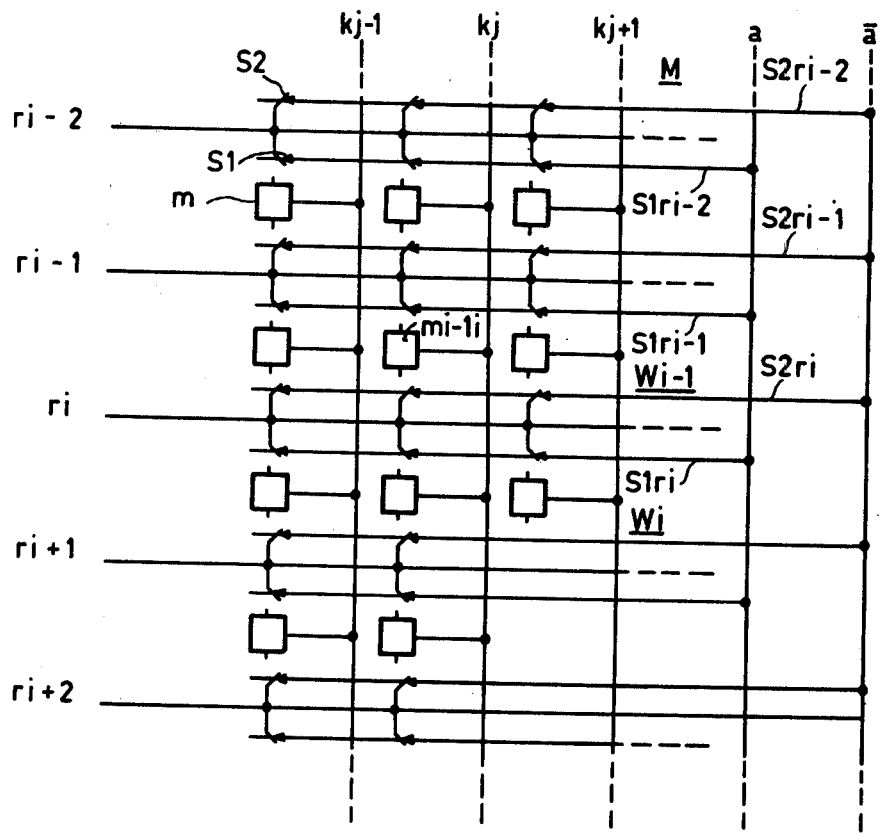
FIG. 1 shows a memory matrix as used in a device according to the invention having first and second selection means for each row and each memory element.

FIG. 1 shows a memory matrix M suitable for use in a device according to the invention by which, upon selection of a row, a memory element associated with the row or a memory element of the adjacent row can be selected. In this matrix selection of each memory element $m$ can be effected, since each row $r_{i-1}$, $r_{1-1}$, $r_i$, ... has first selection means S1 (switches) and second selection means S2 (switches) for each memory element $m$. The outputs of the memory elements $m$ are connected to columns $k_{j-1}$, $k_j$, ... The first selection means S1 are connected to a first drive column $a$ through the first sub-row leads $S1r_{i-2}$, $S1r_{i-1}$, $S1r_i$, ... Similarly the second selection means S2 are connected to a second drive column $\bar{a}$ through second sub-row leads $S2r_{i-2}$, $S2r_{i-}$, $S2r_i$, ... FIG. 1 shows that the provision of the selection means and the relevant leads entirely fit in with the structure of the original memory matrix of the memory M. This is of particular advantage for memories in integrated-circuit form. Operation may roughly be described as follows. It is assumed that a row $r_i$ is selected. It is further assumed that a column $k_j$ is selected. Furthermore the drive column $a$ carries a 0-signal and the drive column $\bar{a}$ a 1-signal. As a result the memory element $m_{ij}$ is selected, for the switch S1 associated with the element $m_{ij}$ is closed via the sub-row lead $S1r_i$ to the drive column $\bar{a}$ which carries the 1-signal. Consequently, in this situation information can be transferred to and from the element $m_{ij}$ via the column $k_j$. If instead of the drive column $a$ carrying an 0-signal the drive column $\bar{a}$ carries a 0-signal and the drive column $a$ carries a 1-signal, the switch S2 is closed through the sub-row leads $S2r_i$. As a result the memory element $m_{i-1,j}$ is selected. Thus upon selection of a given column $k_j$ either the memory element $m_{ij}$ associated with row $r_i$ or the memory element $m_{i-1,j}$ associated with an adjacent row $r_{i-1}$ can be selected in the memory. This means that the row selection does not change but that the signal on the drive columns is the decisive factor. In other words, in the memory matrix each row has two "labels" instead of one, for on selection of one row and one column two memory elements become accessible. If during selection of a row a plurality of column or all columns $K_j$ of a memory matrix are considered, the memory is a word-organized one. If a memory including matrices of the abovedescribed type is word-organized, the memory elements $m$ which together form a word W will be selected. In the example of FIG. 1 on selection of the row $r_i$ with a = 0 ($\bar{a}$ = 1) the word $W_i$ is selected, while with $a = 1$ ($\bar{a} = 0$) the word $W_{i-1}$ is selected.

Figure 2:
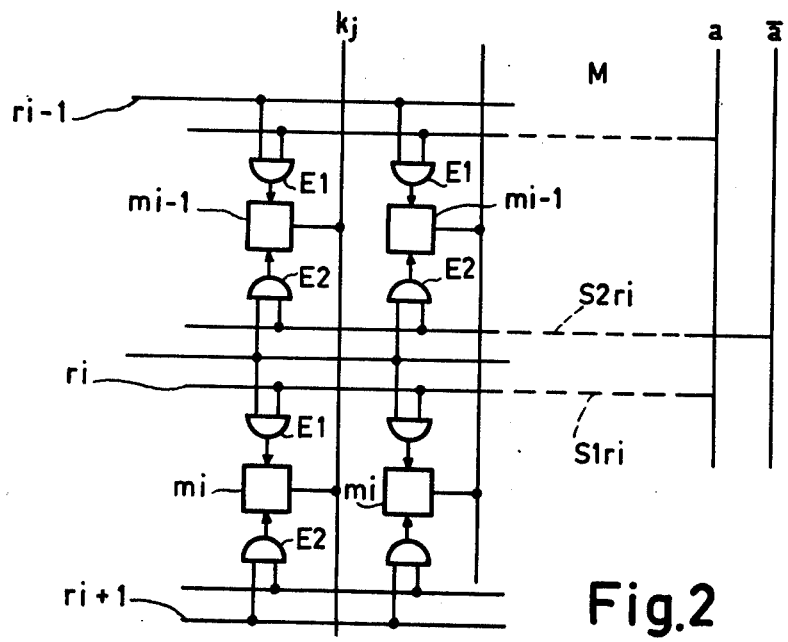
FIG. 2 shows a modified embodiment of the memory matrix of FIG. 1.

FIG. 2 shows embodiment of a memory matrix suitable for use in a device according to the invention which is different in that, starting from the embodiment shown in FIG. 1, the selection means S1 and S2 now are AND function gates E1 and E2. Either the gates E1 will have been put into a state of readiness from the drive column $a$ via sub-row leads $S2r_i$ or the gates E2 will have been put into a state of readiness from the drive column $\bar{a}$ via sub-row leads $S2r_i$. Thus, when a row and one or more columns are selected, information can be transferred either through the gates E1 or through the gates E2. This means that either one or more memory elements $m_i$ associated with row $r_i$ or one or more memory elements $m_{i-1}$ associated with the adjacent row $r_{i-1}$ are selected.

Figure 3:
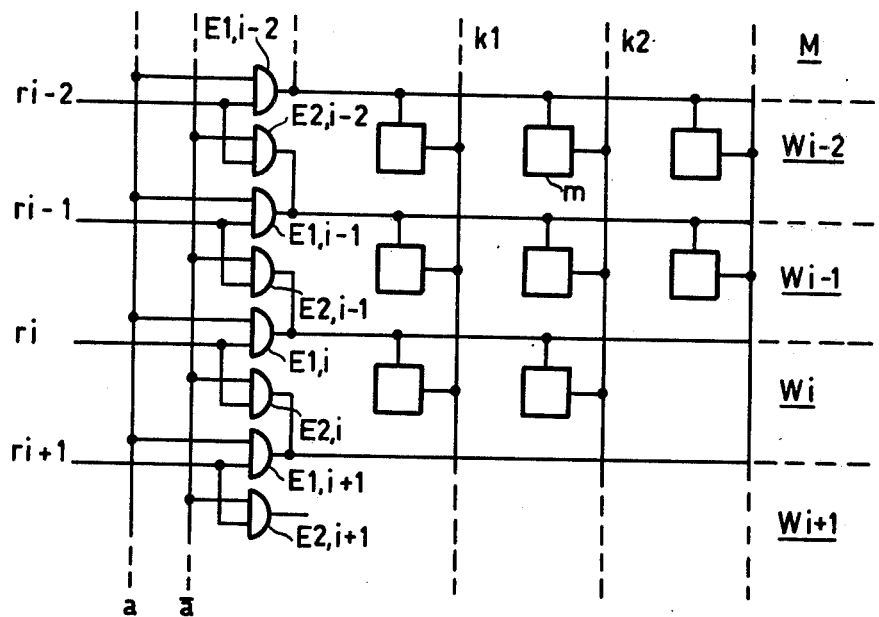
FIG. 3 shows a memory matrix as used in a device according to the invention in which for each row first and second selection means are common to the memory element.

FIG. 3 shows a memory matrix suitable for use in a device according to the invention in which the first selection means, in this embodiment AND function gates $E1_{i-2}$, $E1_{i-1}$, $E1_i$, ... are common to all the memory elements (words $W_{i-2}$, $W_{i-1}$, $W_i$, ... respectively) associated with a row ($r_{i-2}$, $r_{i-1}$, $r_i$, ... respectively), while the second means, in this embodiment AND function gates $E2_{i-2}$, $E2_{i-1}$, $E2_i$, ... are common to all the memory elements (words $W_{i-1}$, $W_i$, $W_{i+1}$, ...) associated with the adjacent rows ($r_{i-1}$, $r_i$, $r_{i+1}$, ... respectively).

This applies to a word-organized memory matrix M. In a manner which fits in with the structure of the matrix of rows and columns, in this embodiment an input of each AND gate $E1_i$, ... is connected to a common drive column $a$. Similarly an input of each AND gate $E2_i$, ... is connected to a common drive column $\bar{a}$. Second inputs of $E1_i$, ... and $E2_i$, ... are connected to the respective inputs of the rows $r_i$. The outputs of the gates $E1_i$, are connected to the rows $r_i$, ... themselves, whilst the outputs of the gates $E2_i$, are connected to the adjacent rows $r_{i+1}$, ... If the column $a$ carries a 0-signal, the gates $E1_i$ are in a state of readiness so that on selection of a row $r_i$ the word $W_i$ will be selected. If the column $a$ carries a 1-signal, the gates $E2_i$, ... are in a state of readiness, so that on selection of the same row $r_i$ the word $W_{i+1}$ will be selected.

Figure 4:
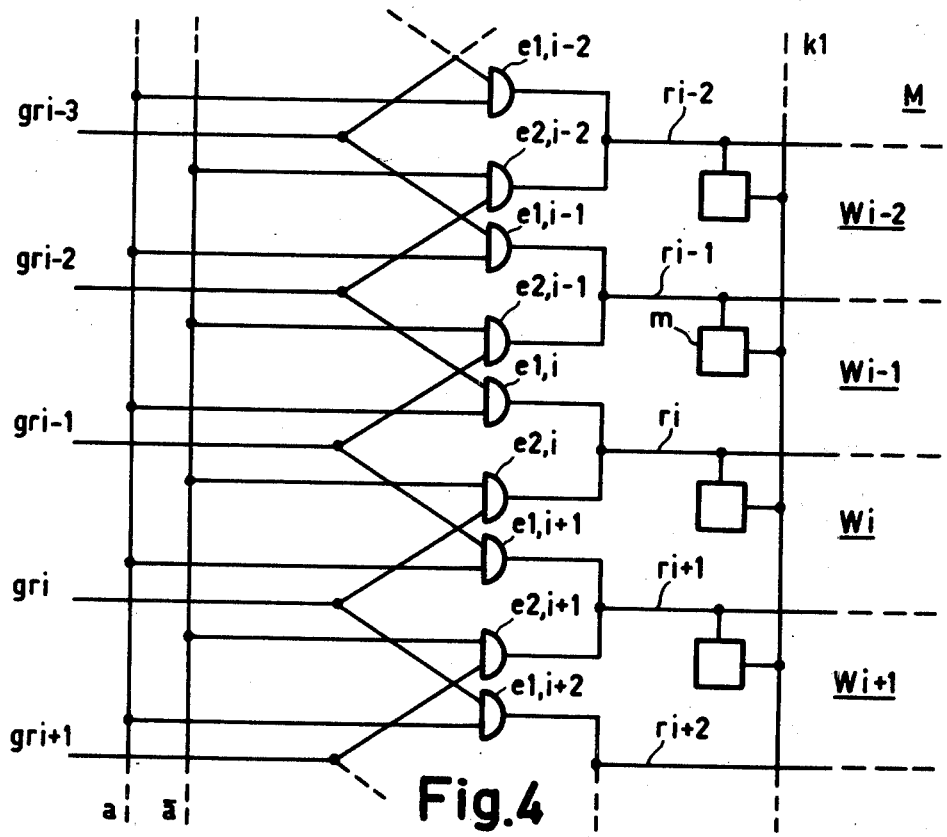
FIG. 4 shows a further embodiment of a memory matrix as used in a device according to the invention.

FIG. 4 shows an embodiment of a memory matrix suitable for use in device according to the invention in which on selection of a row the memory elements associated with this row or the memory elements of a further row, in this embodiment the next subsequent row but one, can be selected. In principle any further row may be chosen as the selectable one. The rows of the matrix again are designated by $r_i$. The Figure further shows a column $k1$ of the matrix and drive columns $a$ and $\bar{a}$. The first selecting means $e1_i$, ... and the second selecting means $e2_i$, ... are common to memory elements $m$ of a row. The external selection (by a decoder or scanner) takes place at row inputs designated $gr_i$, ... As FIG. 4 shows, a row input $gr_i$ is connected to one input of an AND gate $e2_i$ and to one input of an AND gate $e1_{i+2}$. The AND gate $e2_i$ at its other input receives the drive signal from the column $a$, while an AND gate $e1_i$ at its other input receives the drive signal from the column $\bar{a}$. The output of an AND gate $e1_i$ is connected to the output of an AND gate $e2_i$. These outputs are jointly connected to a matrix row $r_i$.

The arrangement described provides the following results:

Selection of, say, a row input $gr_{i-1}$ enables either a word $W_{i-1}$ associated with a row $r_{i-1}$ or a word $W_{i-1}$ associated with the next but one row $r_{i+1}$ of the matrix to be selected. Thus a "step" instruction comprises two steps: a 1-signal on $a$ puts the AND gate $e1_{i+1}$ into a state of readiness so that the selection at the row input $gr_i-_1$ is allowed to pass through this gate so as to reach the row $r_{i+1}$, which is further than $r_{i-1}$ by two rows and would have been selected if there were a 0-signal on the column $a$.

Figures 5, 6B:
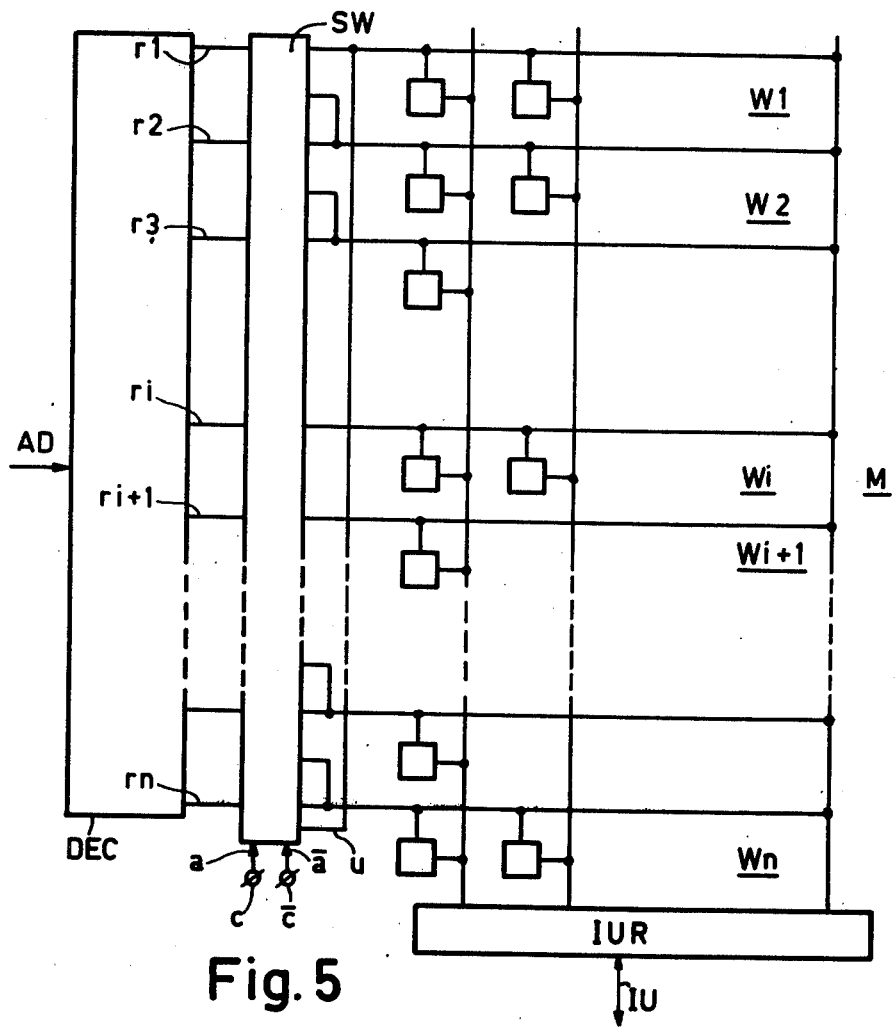
FIG. 5 shows a complete memory for use in a device according to the invention.
FIGS. 6a and 6b show a device according to the invention and an associated table of signals.

FIG. 5 shows a complete memory which may be used in a device according to the invention. The matrix used is of the type described with reference to FIG. 3 with a few peripheral devices. The AND gates $E1_i \ldots E2_i \ldots$ are assumed to be included in a switching device SW. The memory further comprises a decoder DEC and an input/output register IUR with an input/output IU through which the memory is connected to its surroundings. The switching device SW includes the drive columns $a$ and $\bar{a}$ which are linked to the "outer world" by terminals $c$ and $\bar{c}$ respectively. The addresses AD of the rows to be selected are applied to the decoder DEC. A given address, for example $AD_n$, which indicates the row $r_n$, selects the input of the row $r_n$. It is assumed that a 0-signal is applied to the terminal $c$ and hence the terminal $\bar{c}$ carries 1 signal. As a result, the gates $E1_i \ldots$ (FIG. 3) have been put into a state of readiness via the switching device SW so that the word $W_n$ is selected. This information can be transferred to and from the input/output register IUR. If an 1-signal is applied to the terminal $c$ ($\bar{c} = 0$), the gates $E2_i, \ldots$ (FIG. 3) have been put into a state of readiness and the next word, in this case on selection of the row $r_n$ the word $W_{n+1} = W_1$, is selected. This has been achieved because the word $W_n$ lies at the end of the memory matrix and in this embodiment the next word lies one place further, that is to say returning to the beginning again and hence the word $W_1$. This can be obtained in this embodiment by connecting the output of the gate $E2_n$ )of. the gate $E2_{i+1}$ of FIG. 3), which output in FIG. 5 is denoted by $u$, to the row $r_1$ (succeeding the switching device SW).

Figure 6A:
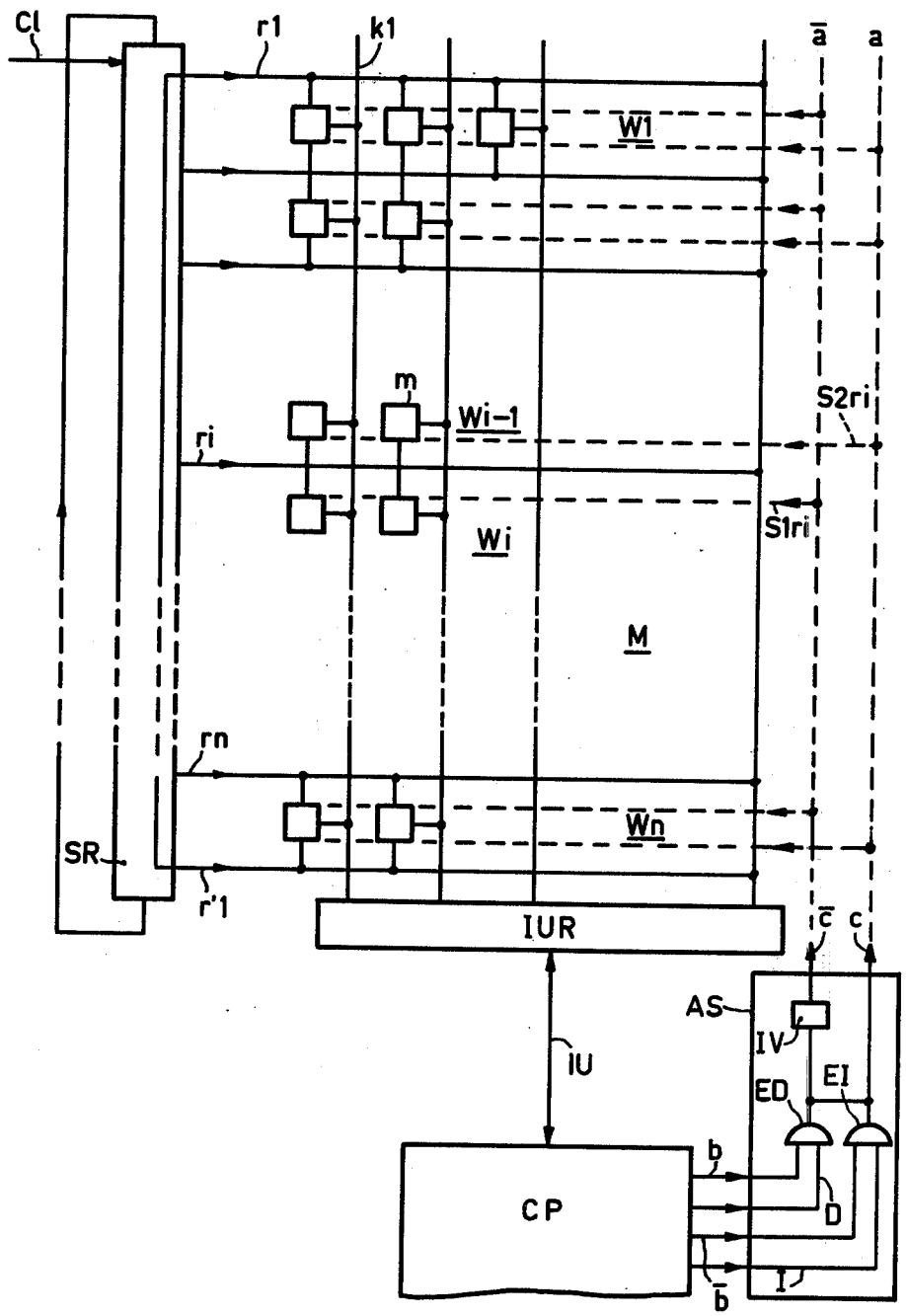

FIG. 6a shows a device according to the invention which includes a matrix M according to the invention as described with reference to FIG. 1 and some further devices, one of which is the control device AS. In this device, row selection is effected by means of a scanning register SR the outputs of which each are connected to a row of the memory matrix M. Under the control of a clock via an input C1 a 1 bit is shifted through the register. The position of the 1 bit denotes a row via the relevant output. Control of the first and second selection means, which in this embodiment are assumed to be included in each memory element, is effected via sub-row leads which are shown in broken lines and are connected to the memory elements, namely first sub-row leads $S1r_i$ and second sub-row leads $S2r_i$. The drive columns $a$ and $\bar{a}$ are controlled via terminals $c$ and $\bar{c}$ respectively from the control device AS which comprises AND gates ED and EI and an inverter IV. The shown device according to the invention further includes an input/output register IUR and a central processor CP. The matrix M has an additional row lead $r'_1$ which is connected to the row $r_1$. This is because, on selection of the row $r_1$ with an 1-signal on $a$, instead of the word $W_1$ the word $W_{1-1} = W_n$ is selected. Thus circulation at the end of the memory is put in order.

The manner in which the shown device according to the invention obeys a one-step INCR(EMENT) I instruction and a one-step DECR(EMENT) D instruction from the processor CP will now be described with reference to the Table of FIG. 6b. An output D of CP carries 1-signal, providing the DECR instruction. An output $b$ carries 0-signal ($\bar{b} = 1$) as long as during a given operation in CP the instruction D need not yet be carried out (CP may for example be performing a search on completion of which the DECR instruction is to be carried out). With $D = 1$ and $b = 0$ and $I = 0$ as well, the AND gates ED and EI are closed, so that the drive device AS at its terminal $c$ does not deliver a signal, whilst via the inverter IV a 1-signal is supplied at the terminal $\bar{c}$. Hence on selection of a row $r_i$ of the memory matrix a word $W_i$ is selected. If now the signal at the output $b$ becomes 1, which means that the instruction DECR is to be carried out, the gate ED is opened and the drive device AS delivers a 1-signal at terminal $c$ and a 0-signal at terminal $\bar{c}$. At this instant on selection of the said row $r_i$ instead of the word $W_i$ the word $W_{i-1}$ is selected. This means execution of the DECR (= "one step back") instruction.

When the instruction INCR I is given the following process takes place:

Output I of CP carries a 1-signal so that the INCR instruction is present. The output b carries 0 signal ($\bar{b} = 1$) as long as INCR need not be carried out. With $I = 1$ and $\bar{b} = 1$ the AND gate EI is open and a 1-signal is available at the terminal c. As a result, on selection of a row $r_i$ the next word $W_{i-1}$ will be selected. If now $b$ becomes 1, which means that the INCR instruction is to be carried out (see last line of FIG. 6b), both gates EI and ED are closed so that the driving device at its terminal $c$ delivers a 0-signal and at its terminal $\bar{c}$ a 1-signal. Thus on selection of the row $r_i$ instead of the word $W_{i-1}$ the word $W_i$ is selected. This means INCR (1 one step forward).

Figure 7:
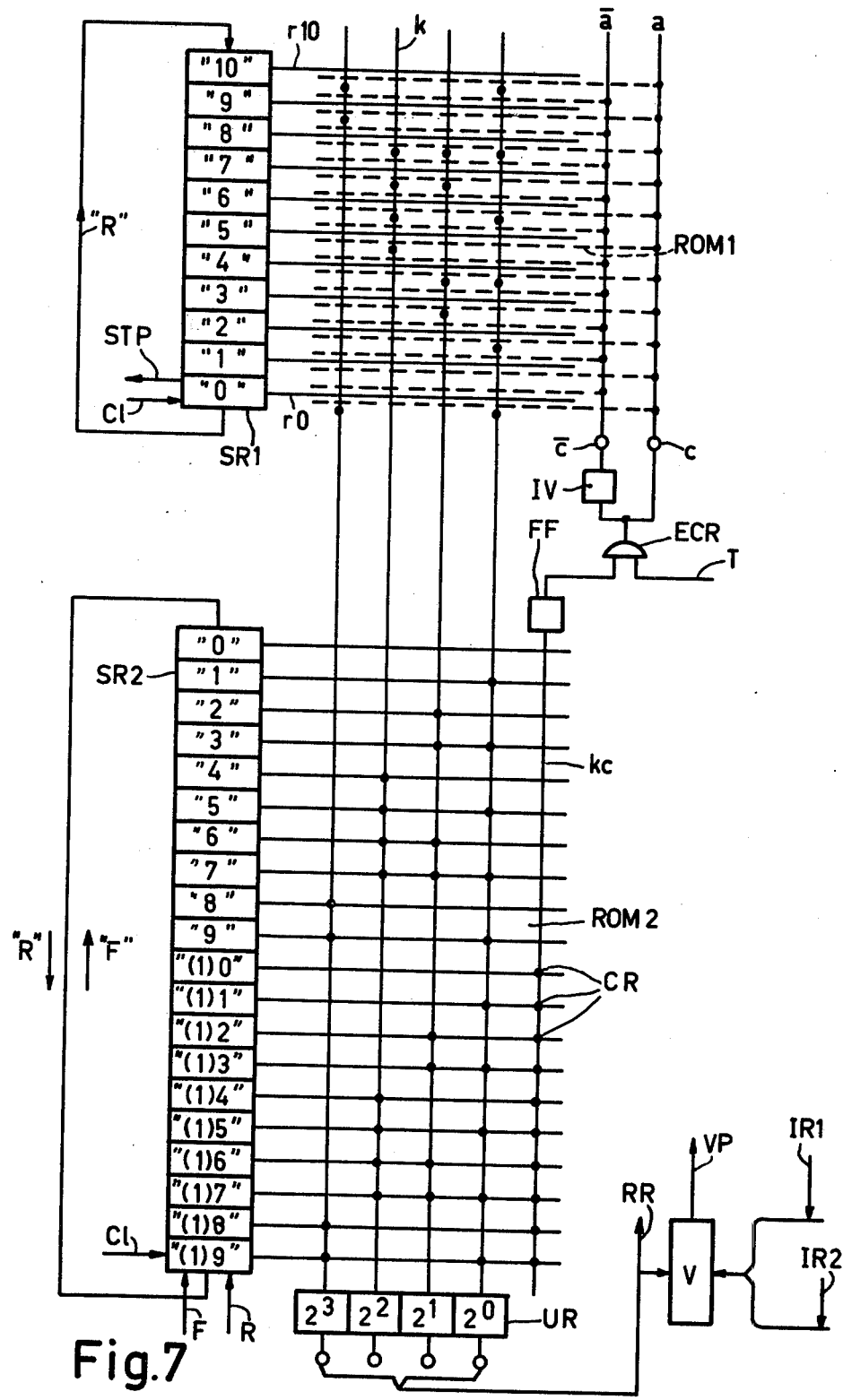
FIG. 7 shows a device according to the invention in which a memory including a read-only memory matrix is used.

FIG. 7 shows a device according to the invention which includes a read-only memory matrix ROM1. FIG. 7 further shows a normal read-only memory matrix ROM2. This has the purpose of showing how, in a device according to the invention, such a read-only memory matrix ROM1 may be used, in particular in a device according to the invention in which carries arise during the performance of arithmetical operations on information. Thus the device of FIG. 7 forms an addition-subtraction arithmetic unit.

FIG. 7 furthermore shows scanners SR1 and SR2, an inverter IV, an output register UR and a comparison device V. ROM1 and ROM2 are interconnected by their columns, so that together they need only one output register UR. ROM1 is filled with a table containing the digits 0 to 9 in BCD code. The digits 0 to 9 are stored twice in ROM2: positions 0 to (1)9. In addition, in positions (1)0 to (1)9 the associated tens carries are stored which thus are at positions (1)0 to (1)9 of ROM2, in column $kc$. A possible embodiment of ROM1 will hereinafter be described more fully with reference to FIGS. 8 and 10. ROM2 may be a known read-only memory by integrated-circuit techniques. In practice operation of the entire set-up is effected from a control device of an information processing device, not shown. Because this device does not form part of the invention, it is not described. We are concerned with showing a method of performing arithmetical operations (addition, subtraction) by means of this device according to the invention. This will now be illustrated. It is assumed that a digit of a number to be processed is applied to an input INCR. It is further assumed that this digit is 6 in BCD code. The digit is applied to the comparison device V. The register UR also is connected to the device V. The contents of VUR are compared with the digit on IR1. The scanner SR1 may be operated by the pulses on C1 (the scanner SR2 is switched off) and on successive selection of the rows $r_{10}, r_9, \ldots$ the values 0.9, $\ldots$ are applied to UR. The column $a$ carries 0-signal and $\bar{a}$ carries 1-signal. At the position of 6 of SR1 equality occurs in V. The scanner Sr1 is stopped from V (signal VP from V). SR1 remains in this position. This means that the said digit 6 is entered in SR1. Similarly a digit applied via an input IR2, for example 3 in BCD code, can be entered in ROM2 by means of the device V: SR2 runs in the upper part of ROM2 (positions 0 to 9) until equality in V is obtained (SR1 is switched off). This happens at position 3. SR2 stops. For addition the following takes place: the scanners DR1 and SR2 are started and operated by pulses on C1, SR1 in the R (return) direction and SR2 in the F(forward) direction. If now SR1 reaches the position 0, it delivers a STOP signal. The scanners stop. In the meantime the scanner SR2 has reached the position 3 plus 6 equals 9. This is the result of the addition. If, say, the digit 7 were applied via IR2, this 7 would be entered into position 7 in ROM2. In this case of addition (ROM1 is at 6) the scanner SR2 travels six steps to stop at position (1) 3. Hence a carry arises which causes a carry 1-signal CR to be set up on column $k_c$, which signal is applied to a flipflop FF. The carry is stored in this flipflop. The result 9 (first case) or 3 (second case) can now be transferred from ROM2 to a result register. This transfer is effected from the output register UR to an output RR.

The arrangment is organized so that when a digit from the input RR is entered in ROM1 there always is a 1-signal at an input T of an AND gate ECR. Hence this gate allows a carry GR stored in FF to pass. This situation obtains in the abovedescribed second case (6 + 7). This means that the drive column A carries a 1 signal via the terminal c. As a result, in the position of the scanner SR1 on a row $r_i$, instead of the digit $i$ the digit (i−1) is selected. If now a digit 5 is applied to V via IR1 and compared with the contents of ROM1, equality occurs if the scanner SR1 is in the position 6, for in this case this means that the digit 5 is selected. At this instant the contents of FF can be cleared.

After a new digit, for example 2, has been entered in ROM2 also, addition of these new digits 2 and 5 plus carry CR equals 6 can be performed. Both scanners are operative until SR1 reaches a 0 position. This happens after six steps, for initially SR1 was in position 6. The result is that in ROM2 the result digit 2 plus 6 equals 8 is reached. In this manner the carry CR can simply be handled in the device according to the invention by using ROM1. In the case of subtraction a similar process take place *mutatis mutandis*. When the scanners SR1 and SR2 are simultaneously operative, they both run in the R direction. Obviously, the arrangement described enables DECREMENT and INCREMENT instructions also to be handled in the manner described with reference to FIGS. 6a and 6b.

At this point the following should be mentioned: The arrangement of FIG. 7 can be manufactured in integrated-circuit form in a manner of great practical advantage. ROM1 and ROM2 can be incorporated in a single chip. This principle may even be extended: in addition to ROM1, ROM2 and the scanners SR1, SR2, further memory sections for storing the numbers to be handled may be provided on the same chip. Whilst retaining the matrix structure of the read-only memories (ROMs) and the further memory sections, which may be read-write memories (RAMs), the selection row leads $r_i$ may be extended into adjacent memory sections. Thus the scanners SR1 and SR2 may be used for row selection not only in the read-only memories but also in adjacent memory sections. The manner in which this is carried into practice is the subject matter of pending U.S. Pat. Application Ser. No. 508,782, now U.S. Pat. No. 3,926,799.

It should be mentioned that the use of the idea of the present invention and that of the aforementioned application enable the arithmetic unit including input registers, a result register, keyboard inputs and decoder to be accommodated on a chip.

To complete the description of the present invention a method of manufacturing a memory matrix suitable for use in a device according to the invention in integrated-circuit form will now be described.

Figure 8:
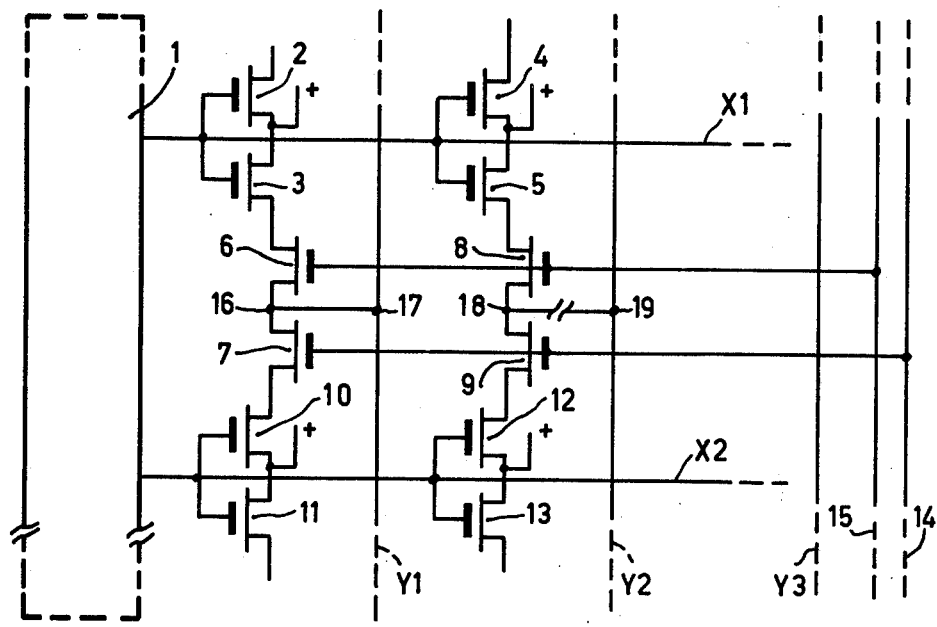
FIG. 8 shows an electric detailed circuit of a read-only memory matrix suitable for use in the device according to the invention as shown in FIG. 7.
Figure 9:
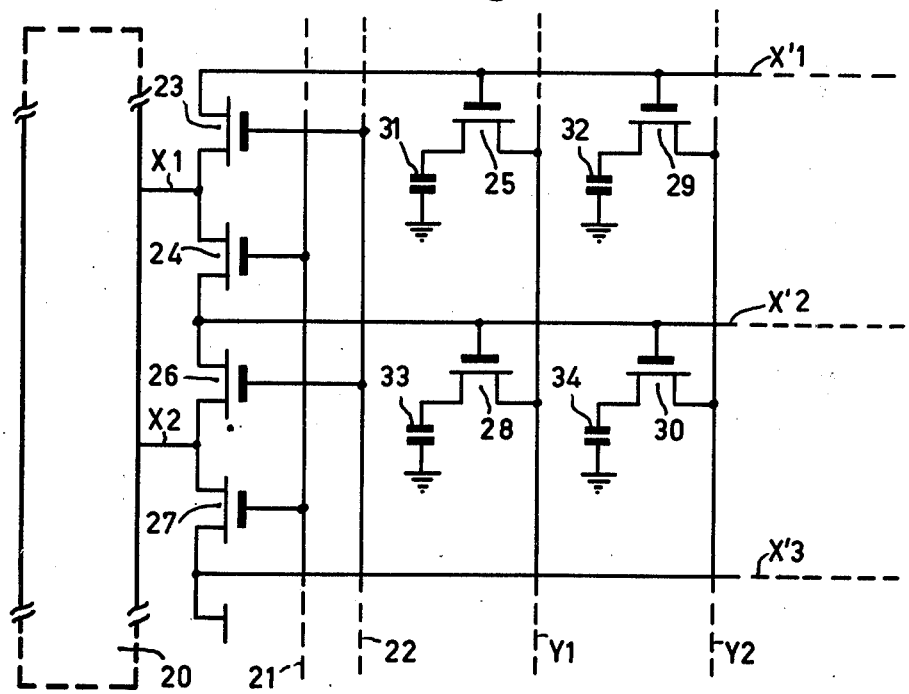
Figure 10:
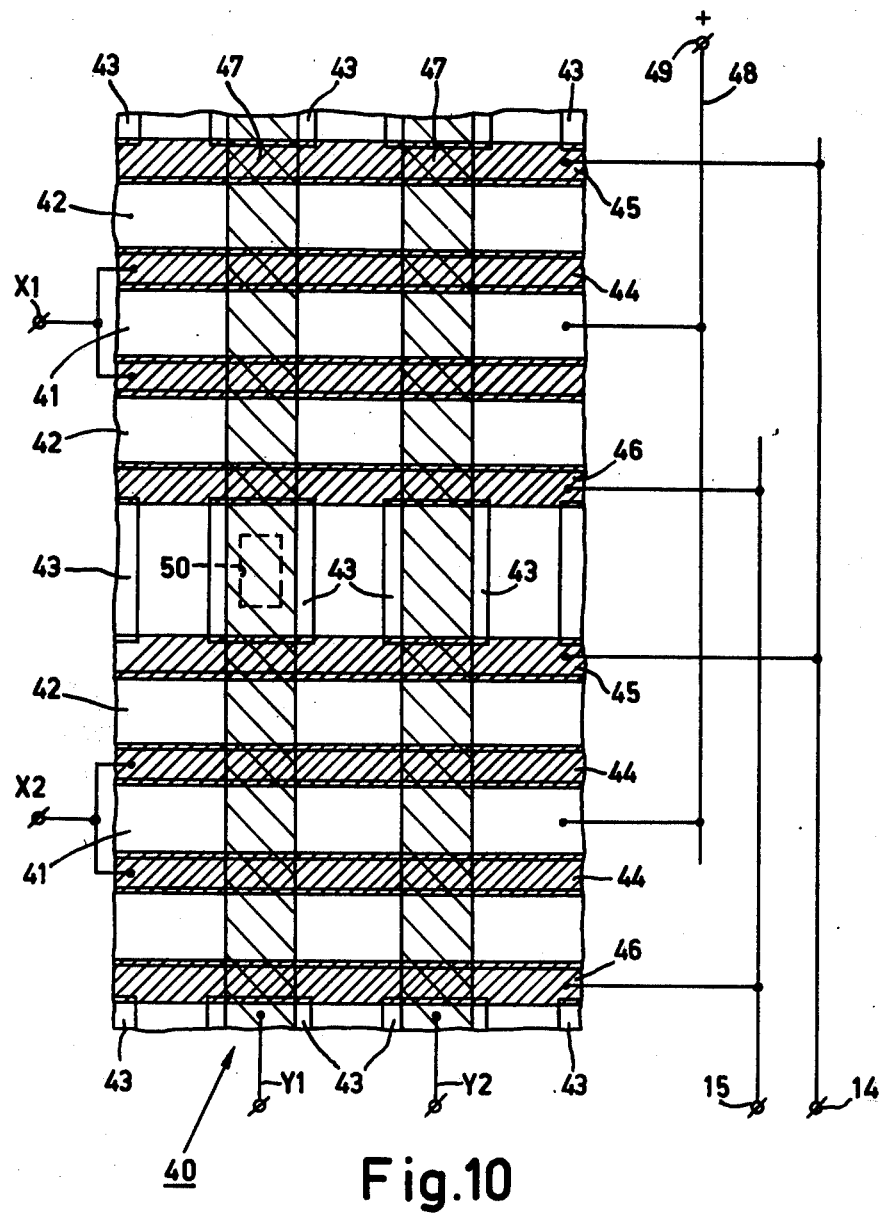
FIG. 10 shows the read-only memory matrix detail of FIG. 8 in integrated circuit form.
Figure 11:
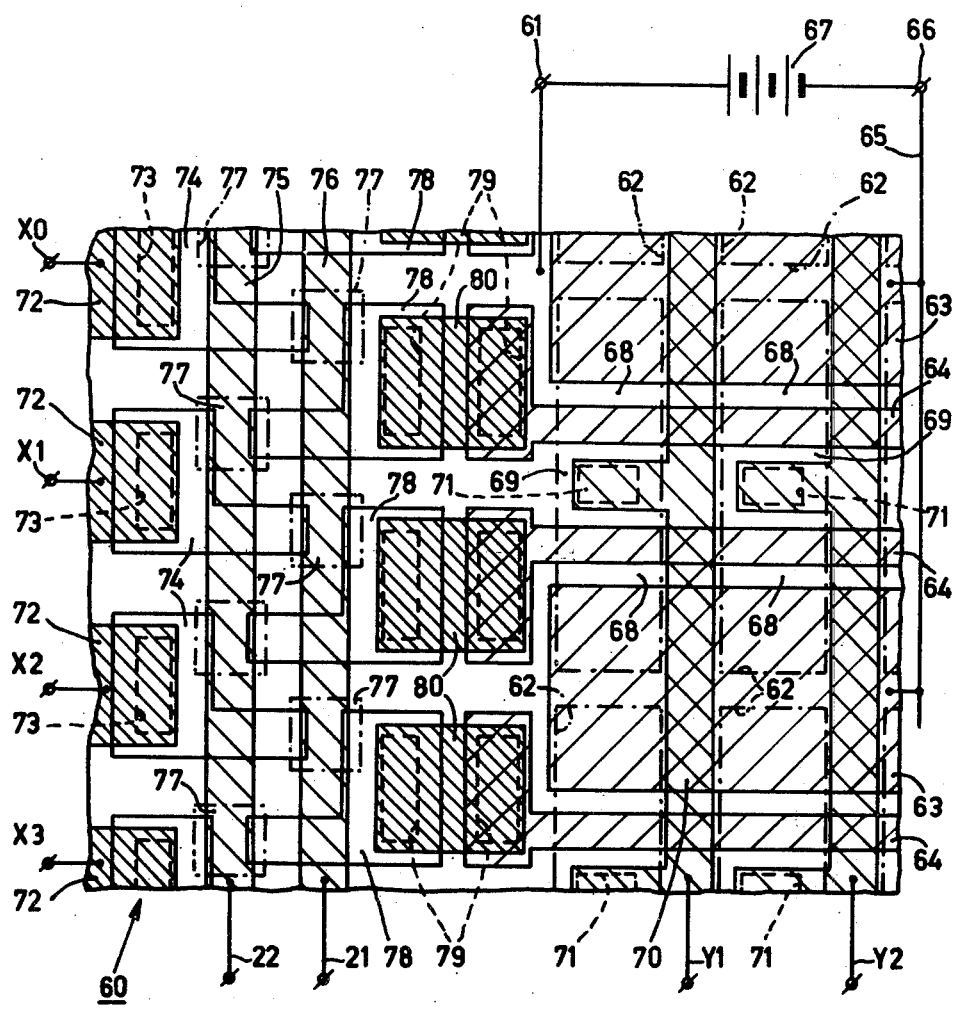
FIG. 11 shows the read-write memory matrix detail of FIG. 9 in integrated circuit form.

FIG. 8 in conjunction with FIG. 10 shows an embodiment of part of the matrix of a read-only memory matrix, whilst FIG. 9 in conjuction with FIG. 11 shows an embodiment of part of the matrix of a read-write memory matrix. In both embodiments, on selection of a given row the memory cells of that row or the memory cells of an adjacent row can be selected.

FIG. 8 shows an embodiment of a memory matrix of the read-only type. The matrix comprises column Y1 and Y2 and rows X1 and X2. Evidently greater numbers of columns and rows may be used, but for the sake of clarity the limited numbers are described.

The row X1 at one end is connected to the junction point of the gates of transistors 2 and 3 and at the other end to the junction point of the gates of transistors 4 and 5. The row X2 at one end is connected to the junction point of the gates of transistors 10 and 11 and at the other end to the junction point of the gates of transistors 12 and 13. The gates of transistors 6 and 8 are jointly connected to a drive column lead 15. The gates of transistors 7 and 9 are jointly connected to a drive column lead 14. The main current path of the transistors 2, 3, 6, 7, 10 and 11 are connected in series. The junction point of the main current paths of the transistors 2 and 3 and the junction point of the main current paths of the transistors 10 and 11 are connected to a point of constant potential. A junction point 16 of the main current paths of the transistors 6 and 7 is connected to a point 17 of the column lead Y1. The main current paths of the transistors 4, 5, 8, 9, 12 and 13 are connected in series. The junction point of the main current paths of the transistors 4 and 5 and the junction point of the main current paths of the transistors 12 and 13 are connected to a point of constant potential. In this embodiment the memory locations in the matrix are constituted by the presence or absence of connections between the column leads and the junction points of the main column paths of the associated transistors the gates of which are connected to the driving column leads 14 and 15 respectively. For example, there is a connection between the point 16 and the point 17 of the column lead Y1 but there is no connection between a junction point 18 and a point 19 of the column lead Y2. The presence of the said connections may characterize logic 1 and the absence may characterize logic 0. Thus a read-only memory matrix is obtained.

FIG. 9 shows a second embodiment of a memory matrix. It is a read-write memory matrix of the dynamic type. It comprises four memory elements arranged in two rows and two columns. Obviously any suitable number of elements may be used. The memory elements are of the dynamic type and comprise transistors 25, 28, 29 and 30 and associated capacitors 31, 32, 33 and 34 respectively. The gates of the transistors 25 and 29 are connected to a row lead X'1 and the gates of the transistors 28 and 30 are connected to a row lead X'2. The main current path of the transistor 25 is connected between a column lead Y1 and the capacitor 31. The main current path of the transistor 28 is connected between the column lead Y1 and the capacitor 33. The capacitor 32 is connected by the main current path of the transistor 29 to a column lead Y2, and the capacitor 34 is connected by the main current path of the transistor 30 to this column lead Y2. The terminals of the capacitors 31, 32, 33 and 34 not connected to a point of constant potential, for example to earth. The series combination of the main current paths of transistors 23 and 24 is connected between the row leads X'1 and X'2. The gate of the transistor 23 is connected to a drive column lead 22, and the gate of the transistor 24 is connected to a drive column lead 21. The junction point of the main current paths of the transistors 23 and 24 is connected by a lead X1 to a decoder or scanner 20. The sereis combination of the main current paths of transistors 26 and 27 is connected between row leads X'2 and X'3. The gate of the transistor 26 is connected to the drive column lead 22, and the gate of the transistor 27 is connected to the drive column lead 21. The junction point of the main current paths of the transistors 26 and 27 is connected by a LEAD X2 to a decoder or scanner 20.

The memory matrices shown in FIGS. 8 and 9 can be manufactured in integrated-circuit form by means of techniques commonly used in semiconductor technology. In this connection it should be mentioned that the field-effect transistors shown in FIGS. 8 and 9 may entirely or in part be replaced by bipolar transistors. However, the use of insulated-gate field-effect transistors in particular enables comparatively compact matrices to be obtained, and an example of such an integrated circuit will not be described with reference to FIG. 10.

FIG. 10 shows part of a semiconductor chip 40, made for example of n-type silicon, in which the circuit arrangement of FIG. 8 is implemented by insulated-gate field-effect transistors of the enhancement type having a p-type channel. The n-type chip 40 has p-type surface regions 41, 42 and 43, while on the surface of the chip a cross-bar system of conductor paths is provided which comprises conductor paths 44, 45 and 46 separated from the chip surface by a layer of an insulating material and conductor paths 47 which extend substantially at right angles to the afore-mentioned conductor paths. The conductor paths are shown by shading. The substantially parallel arranged conductor paths 44, 45 and 46 are separated from the conductor paths 47 by an insulating layer.

In FIG. 8 the transistors of each of the transistor pairs 2, 3; 4, 5; 10, 11 and 12, 13 have a common electrode region, all these regions being connected to the same reference potential. In the integrated circuit the electrode regions are in the form of regions 41 which extend throughout the length of the rows of the matrix. At the edge of the matrix the regions 41 can be connected by a conductive path 48, shown schematically, to one another and to a terminal 49 for connection to a voltage supply source.

The transistors of the pairs 3, 6; 5, 8; 10, 7 and 12, 9 also have common electrode regions. In the integrated circuit form of the matrix the fact is utilized so that the common electrode regions of the pairs 3, 6 and 5, 8 may be interconnected without adversely affecting the operation of the memory matrix. For the same reason the common electrode regions of the pairs 10, 7 and 12, 9 may also be interconnected. Hence in FIG. 10 each region 41 is flanked on either side by likewise continuous regions 42.

The regions 41 and 42 are separated by channel regions which adjoin the chip surface and over which gate electrodes 44 extend. The FIG. shows schematically that the two gate electrodes situated on opposite sides of each region 41 are interconnected, for example at the edge of the memory matrix. These pairs of interconnected gate electrodes constitute the row conductors X1, X2, and so on.

The transistors of the transistor pairs 6, 7 and 8, 9 respectively also have common electrode regions. These common electrode regions are constituted by surface regions 43 and correspond to points 16 and 18 in FIG. 8. The regions 42 and 43 are separated by channel regions which can be controlled by means of insulated gate electrodes 45 and 46. At the edge of the matrix all the gate electrodes 45 are connected to the drive column conductor 14 and all the gate electrodes 46 are connected to the drive column conductor 15, as is shown schematically.

The information contents of the memory matrix are determined by the presence or absence of connections between the regions 43 and conductors 47, which conductors each extend over a column of regions 43 and form the conductors leads Y1, Y2, and so on. For example, the column lead Y1 is connected through an opening 50 formed in the insulating layer to a region 43 at the centre of Figure while there is no such opening over the adjacent region 43. The latter while there is no such opening over the adjacent region 43. The latter region 43 thus is not connected to the associated column lead Y2.

The integrated circuit described can entirely be manufactured by methods commonly used in semiconductor technology. For example, the surface regions may be made by diffusion or by ion implantation. The insulating layer may consist, for example, of silicon oxide and/or silicon nitride. The conductive paths may be made of aluminium, molybdenum or a semiconductor material. The gate electrodes, which in the Figure extend in the horizontal direction, may advantageously consist of polycrystalline silicon while the conductive paths which in the Figure extend in the vertical direction may be made of a metal, for example aluminium.

Instead of p-channel field effect transistors, n-channel field-effect transistors may be used.

The second embodiment of the memory matrix the circuit diagram of which is shown in FIG. 9 may also be manufactured in integrated-circuit form. The memory matrix concerned is a comparatively arbitrarily chosen one in the sense that within the scope of the invention the type of memory cell to be used in the matrix may be selected substantially freely from the cells known for use in memories both of the dynamic and the static type. Furthermore, besides memory cells comprising field-effect transistors memory cells comprising bipolar transistors may be used.

In a read-write memory each memory cell may be associated with switches which are incorporated in a manner similar to that described with reference to the first embodiment. Depending upon the choice of the type of memories they may be combined to form large switches each common to a row, as described with reference to the preceding embodiment. In the present embodiment a further possibility is used in which the switches are provided laterally of the memory matrix between the latter and the decoder or scanner 20 (FIG. 9).

The right-hand part of the embodiment shown in integrated circuit form in FIG. 11 shows a conventional memory matrix having cells of the type using one transistor for each bit. The transistors are insulated-gate field-effect transistors made of polycrystalline silicon, the memory capacitors being in the form of the capacitance between an insulated polycrystalline electrode and an inversion layer produced in a semiconductor chip 60 under each such electrode.

The semiconductor chip 60 is made, for example, of n-type silicon which, for example on its lower surface, has a terminal 61 shown schematically. The upper surface of the semiconductor chip carries an insulating layer the thickness of which at the areas enclosed by dot-dash lines 62 is appreciably less than outside these lines. Insulated electrodes 63 and 64 of polycrystalline silicon extend across an insulating layer. The electrodes 63 are interconnected by a lead 65 at the edge of the matrix. They constitute the electrodes of the memory capacitors 31 to 34 (FIG. 9) which are connected to a point of reference potential. The lead 65 is connected via a terminal 66 and a voltage supply 67 to the terminal 61, the electrodes 63 having a negative potential such relative to the semiconductor chip 60 that at the area at which the insulating layer is thin beneath each of the electrodes 63 discrete inversion layers are produced which are in thermal balance. Each of these inversion layers on one side in the semiconductor chip adjoins a p-type electrode region 68 of a field-effect transistor, the other p-type electrode region 69 of which is connected to a conductive path 70. Each region 69 is common to the two adjacent transistors of the memory cells of adjacent rows. In order to establish a connection to the relevant conductive path 70 openings 71 have been formed in the insulating layer.

The conductive paths 70 form the column leads Y1, Y2, and so on of the memory matrix. The gate electrodes 64 of the transistors 68, 64, 69, which electrodes also form the row leads X'1, X'2, X'3, and so on, extend in a direction at right angles to the paths 70. For the sake of clarity the relatively insulated conductive paths which extend in the various directions are indicated in the Figure by shading in different directions.

The left-hand part of FIG. 11 shows a possible manner of manufacturing the switches 23 to 27 of FIG. 9 in integrated-circuit form. Near the left-hand edge of the Figure conductive paths 72 extend which form the leads X1, X2, and so on of FIG. 9. The paths 72 are connected through openings 73 formed in the insulating layer to p-type electrode regions 74 which each are common to two field-effect transistors. The gates of these transistors are constituted by conductive paths 75 and 76 which furthermore correspond to the driving column leads 21 and 22 of FIG. 9. At the areas of the channel regions of these transistors the insulating layer has thin parts 77 indicated by dot-dash lines. The said field-effect transistors furthermore have electrode regions 78 which each also are common to two transistors. However, compared to the common regions 74 the regions 78 are shifted, so that each region 74 can be connected by the gate electrode 75 to a first region 78 and by the gate 76 to an adjacent second region 78. Each of the electrode regions 78 is connected through a conductive layer 80 and openings 79 formed in the insulating layer to one of the conductive paths 64 and hence to a rowlead of the memory matrix.

The conductive layers 80 and the conductive paths 72, 75 and 76 may be made of aluminium or an other suitable metal. In this case the field effect transistors in the left-hand part of the Figure will be manufactured by another technique than the transistors incorporated in the memory matrix. As an alternative, however, the conductive paths 75 and 76 may be made of polycrystalline silicon, and the field-effect transistors in the left-hand part may be manufactured by the same self-aligned techniques as preferentially used in the memory matrix.

In the embodiment described the leads X0, X1, X2, and so on are connected to an electrode region 74 and the current required for charging and discharging the column leads X'1, X'2, and so on must flow through the said conductors X0, X1, and so on. In a modification of this embodiment the electrode regions 74 are not directly connected and opposite them there is another elongate p-type surface region which extends in the column direction and is connected to a supply or clock voltage source. This surface region in conjunction with each region 74 forms a further field-effect transistor the gate of which is constituted by the associated lead X0, X1, and so on respectively. In this manner the aforementioned charing currents do no flow through the decoder or the scanner but flow through the clock voltage terminal. This may improve the speed. Furthermore the field effect transistors which serve as the switches 23 to 27 may be in the form of transistors having a higher ratio of channel width to channel length which can simply be realized by turning the channel regions through 90° with the respect to the situation shown in FIG. 11. Thus the switches are constitued for example by a row of adjoining surface regions which alternatively correspond to the regions 74 and 73 of FIG. 11. The gate electrodes then extend between these regions in a direction parallel to the conductive paths 64. The drive column leads which extend at right angles to these gate electrodes now may be situated between the switches and the matrix of memory cells. This topology enables in particular the channel width of the field effect transistors to be simply adapted to the speed requirements to be satisfied by the memory matrix.

What is claimed is:

1. A memory storage device, comprising a plurality of memory elements organized as a matrix of rows and columns, ech of said rows including at least one marked memory element associated therewith;
    first selection means having a first terminal associated therewith for selection of a first predetermined one of said rows;
    second selection means, having a second terminal associated therewith for selection of a second predetermined one of said rows;
    control means comprising first and second signal lines coupled with said respective first and second terminals, and a logical component for supplying a control signal to said first and second selection means, said control signal being applied to said first terminal and the complement of said control signal being supplied to said second terminal; and
    means for activating said control means, by means of a single predetermined instruction, comprising a central processor having a plurality of control lines, including a control line, activated by an increment instruction executed by said central processor, connected to said control means.

* * * * *

UNITED STATES PATENT AND TRADEMARK OFFICE
CERTIFICATE OF CORRECTION

PATENT NO. : 4,041,474
DATED : August 9, 1977
INVENTOR(S) : CLAUDE J.P.F. LE CAN It is certified that error appears in the above-identified patent and that said Letters Patent are hereby corrected as shown below:

Column 1, line 5, "Oct. 7, 1976" should be --Oct. 7, 1974--
          line 48, "invention" should be --inventive--

Column 2, line 31, "spread" should be --speed--
          line 36, "funtion" should be --function--
          line 42, "magentic" should be --magnetic--
          line 48, "instruction" should be --instructions--

Column 4, line 17, "second" should be --second selection--
          line 25, "$El_1,...$" should be --$El_i,...$--
          line 62, "$W_{i-1}$" (second occurrenc) should be -- $W_{i+1}$ --.

Column 7, line 25, "arrangment" should be --arrangement--
          line 68, "pending" should be --copending--

Column 8, line 14, "whilst" should be --while--

Column 9, line 16, "sereis" should be --series--

Column 10, lines 30-31, "The latter while there is no such opening over the adjacent region 43." should be deleted

UNITED STATES PATENT AND TRADEMARK OFFICE
CERTIFICATE OF CORRECTION

PATENT NO. : 4,041,474

DATED : August 9, 1977

INVENTOR(S) : CLAUDE J.P.F. LE CAN

It is certified that error appears in the above-identified patent and that said Letters Patent are hereby corrected as shown below:

Claim 1, line 3, "ech" should be --each--

Signed and Sealed this

Seventh Day of February 1978

[SEAL]

Attest:

RUTH C. MASON
Attesting Officer

LUTRELLE F. PARKER
Acting Commissioner of Patents and Trademarks